US006747447B2

(12) United States Patent
Markert et al.

(10) Patent No.: US 6,747,447 B2
(45) Date of Patent: Jun. 8, 2004

(54) LOCKING APPARATUS AND LOADBOARD ASSEMBLY

(75) Inventors: Niels Markert, Santa Clara, CA (US);
Anthony Le, Santa Clara, CA (US);
Robert Sauer, Santa Clara, CA (US);
Rochit Rajsuman, Santa Clara, CA (US);
Hiroki Yamoto, Santa Clara, CA (US)

(73) Assignee: Advantest Corporation, Ora-gun (JP)

( * ) Notice: Subject to any disclaimer, the term of this patent is extended or adjusted under 35 U.S.C. 154(b) by 7 days.

(21) Appl. No.: 10/254,401

(22) Filed: Sep. 25, 2002

(65) Prior Publication Data

US 2004/0056675 A1 Mar. 25, 2004

(51) Int. Cl.$^7$ .................... G01R 31/02; G01R 1/073
(52) U.S. Cl. .................. 324/158.1; 324/758; 324/765
(58) Field of Search ............... 324/158.1, 754, 324/755, 758, 761, 765

(56) References Cited

U.S. PATENT DOCUMENTS

| 5,068,601 A | * | 11/1991 | Parmenter ................ 324/754 |
| 5,923,180 A | * | 7/1999 | Botka et al. ............. 324/758 |
| 6,114,869 A | * | 9/2000 | Williams et al. ......... 324/765 |
| 6,166,553 A | * | 12/2000 | Sinsheimer .............. 324/754 |

\* cited by examiner

Primary Examiner—Ernest Karlsen
(74) Attorney, Agent, or Firm—Morrison & Foerster LLP (57) ABSTRACT

The present invention is directed to a locking apparatus and loadboard assembly of a semiconductor testing device apparatus. The loadboard assembly includes a printed circuit board containing a device under test and an interface board secured to the bottom of the printed circuit board. The interface board has two members with a space between them. Spacers connect the members to form apertures for contact pins on a test head. The loadboard assembly is placed on top of a locking apparatus which is mounted on the top surface of the test head. The placement of the loadboard on the locking apparatus is done according to two pins of different cross-sections that extend through two holes in the interface board and printed circuit board of the loadboard assembly. When the loadboard assembly is placed on the locking mechanism, rollers mounted on the interface board are received in cam slots of a cam member of the locking apparatus. These rollers follow the cam slots as the cam member is moved. Based on the profile of the cam slots, the loadboard assembly can be gradually lowered to achieve contact between the printed circuit board and the contact pins on the test head and to lock the interface board.

13 Claims, 6 Drawing Sheets

LOCKING APPARATUS AND LOADBOARD ASSEMBLY

BACKGROUND OF THE INVENTION

1. Field of the Invention

The present invention relates to a locking apparatus and loadboard assembly for use in a semiconductor device testing apparatus and, more particularly, to a locking apparatus and loadboard assembly that provide unrestricted access to the loadboard, place no limitations on the size of the loadboard, ensure the correct alignment of the loadboard and provide even pressure on spring-loaded contact pins for proper testing.

2. Description of the Related Art

Semiconductor device testing apparatuses test various types of semiconductor devices including integrated circuits. Integrated circuits are tested to ensure that they will function properly in the consumer domain. Because integrated circuits must be individually tested, it is desirable that a semiconductor device testing apparatus accurately test integrated circuits at a low manufacturing test cost.

During the fabrication process, integrated circuits are tested in wafer form and in packaged form. In wafer form, a probe card is used to establish a temporary electrical contact between the integrated circuit to be tested (known as the device-under-test or DUT) and the semiconductor device testing apparatus (known as automatic test equipment or ATE). After completion of testing in wafer form, the integrated circuit is packaged and tested. Testing in packaged form includes a performance board or loadboard as the interface between the DUT and the ATE. The loadboard is a multi-layer printed circuit board that is mounted directly on the ATE. The DUT is inserted into a socket on the loadboard to establish electrical contact for testing.

Figure 1:
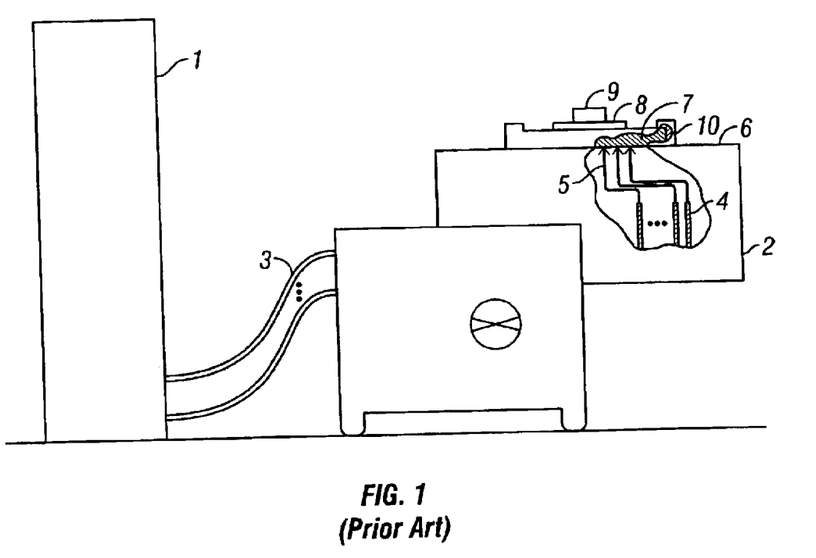
FIG. 1 is a cut-away side view of a conventional automatic test equipment system.

FIG. 1 illustrates a conventional ATE system for testing an integrated circuit in packaged form. A tester 1 generates test signals which are transmitted to a test head 2 through cables 3. The test head 2, as shown by the cut-away view, houses a plurality of printed circuit boards or pin cards 4. The test signals are transmitted from the pin cards 4 to contact pins or pogo pins 5. The contact pins are represented schematically in FIG. 1 by arrows. It should be noted that the number of contact pins is much greater than what is illustrated in FIG. 1 and that the various elements of the ATE system in FIG. 1 are not drawn to scale.

The pogo pins 5 are spring-loaded and press against the loadboard 7 to establish electrical contact for testing. The loadboard 7 is positioned for such contact by being directly placed on the top surface 6 of the test head 2, known as the test head chassis or Hifix. The loadboard 7 is in turn a mount for socket 8. The DUT 9 in packaged form is inserted into socket 8 to establish electrical contact for testing. Thus, the test signals are transmitted from the tester 1 to the DUT 9 through the pin cards 4, contact pins 5, loadboard 7 and socket 8. The resulting signals from the DUT 9 are received by the tester 1 for evaluation through the same elements.

During testing, it is necessary to tightly secure the loadboard 7 to prevent any movement of the ATE from affecting the electrical contacts. This is typically achieved by a locking mechanism. The conventional locking mechanisms include a fixed slot with clamping to secure the loadboard and electrically or pneumatically controlled mechanisms to hold the loadboard in its position. FIG. 1 illustrates a portion of a conventional locking mechanism. The cut-away view shows a section of a securing structure 10 that keeps the loadboard in place.

Figure 2:
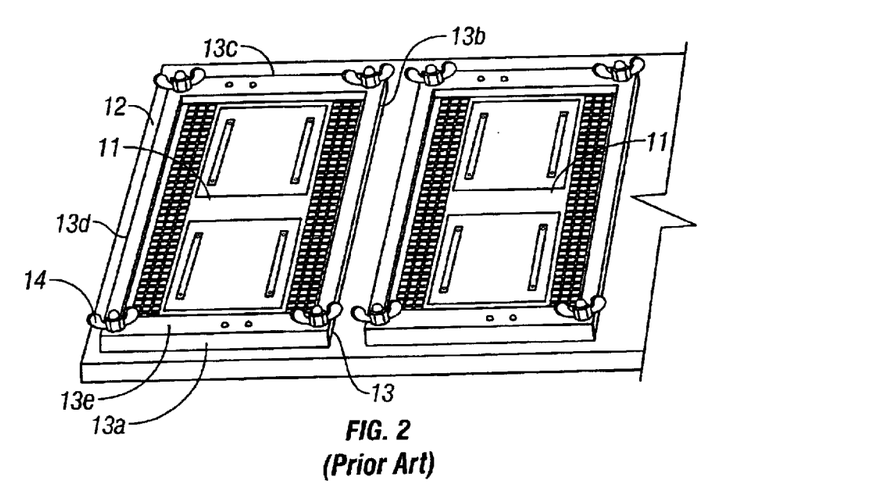
FIG. 2 is a perspective view illustrating a section of the top surface of a test head.

FIG. 2 illustrates a close-up view of the top surface of a test head for a conventional ATE. Two identical loadboards 11 without any mounted sockets are shown on only a portion of the top surface 12. Each loadboard 11 is placed, secured and locked to the top surface 12 such that its sides are completely covered and its top surface is partially covered by the securing structure 13. Specifically, the securing structure 13 has four walls 13a 13b 13c 13d that surround the loadboard 11 on its four sides. The securing structure also has a top face 13e that partially covers the top surface of the loadboard 11. When the loadboard 11 is secured to the top surface 12 by bolts 14, the loadboard 11 is contained on its four sides and its top surface by the securing structure 13 thereby limiting the size of the loadboard and restricting access to it.

Loadboard size and access are important criterion for integrated circuit testing in a mass manufacturing environment. A large size loadboard allows for testing of multiple DUTs in parallel, thereby providing significant savings in manufacturing test cost. Unrestricted access provides further significant savings by reducing access time and maintenance and repair time. In view of the importance of size and access to lowering manufacturing test cost, the limitations on size and the restrictions on access placed by conventional locking mechanisms on loadboards such as in FIG. 2 preclude lowering manufacturing test cost.

Aside from the loadboard size and access, loadboard orientation is another factor affecting manufacturing test cost. When a loadboard is placed on the top surface of the test head, it must be oriented correctly for proper testing. Determining the correct orientation without orientation aids can be time consuming, and an improperly oriented loadboard on the top surface can be costly to correct. The loadboard 11 in FIG. 2 was placed on the top surface 12 without any orientation aids to ensure correct alignment. The absence of such orientation aids to guarantee correct alignment is another drawback of conventional locking mechanisms such as in FIG. 2.

Another factor affecting manufacturing test cost is the quality of the contact between the contact pins and the loadboard. The contact pins are spring-loaded and press against the loadboard to establish electrical contact for testing. If the loadboard does not provide even pressure on the contact pins, some contact pins may not properly press the loadboard for testing. Conventional ATEs use electric or pneumatic controlled levers to hold the loadboard in its position. However, these mechanisms are expensive and costly to maintain and repair.

BRIEF SUMMARY OF THE INVENTION

It is an object of the present invention to provide a locking apparatus and loadboard assembly that overcome the above limitations of conventional locking mechanisms. The locking apparatus and loadboard assembly of the present invention provide unrestricted access to the loadboard, do not limit the size of the loadboard, ensure correct orientation of the loadboard and provide even pressure between the loadboard and the contact pins for proper testing. Furthermore, the locking apparatus and loadboard assembly can be manufactured independently at low cost.

In one embodiment of the present invention, the loadboard assembly includes a printed circuit board containing a device under test and an interface board secured to the bottom of the printed circuit board. This arrangement provides stiffness to the printed circuit board. It also allows for the entire top surface of the printed circuit board to be exposed, thereby eliminating any restrictions on size and access for the printed circuit board.

The loadboard assembly is then placed on top of a locking apparatus which is mounted on the top surface of a test head. The placement of the loadboard on the locking apparatus is done by aligning two pins of different cross-sections to extend through two holes in the interface board and printed circuit board of the loadboard assembly. This ensures that the loadboard assembly has the correct orientation for testing. Furthermore, by placing the loadboard assembly on top of the locking apparatus, access to the loadboard remains unrestricted and loadboard size remains unlimited.

When the loadboard assembly is placed on the locking mechanism, rollers mounted on the interface board are received in cam slots of a cam member of the locking apparatus. These rollers follow the grooves of the cam slots as the cam member is moved. Based on the shape of the cam slots, the loadboard assembly can be gradually lowered to achieve contact between the printed circuit board and the contact pins on the test head and to lock the interface board. In this manner, even pressure is applied to the contact pins to ensure proper testing.

These and other features and advantages of embodiments of the present invention will be apparent to those skilled in the art from the following detailed description of the embodiments of the invention, when read with the drawings and the appended claims.

DETAILED DESCRIPTION OF THE INVENTION

In the following description of preferred embodiments, reference is made to accompanying drawings which form a part hereof and in which is shown by way of illustration specific embodiments in which the invention may be practiced. It is to be understood that other embodiments may be utilized and structural changes may be made without departing from the scope of the preferred embodiments of the present invention.

Figure 3:
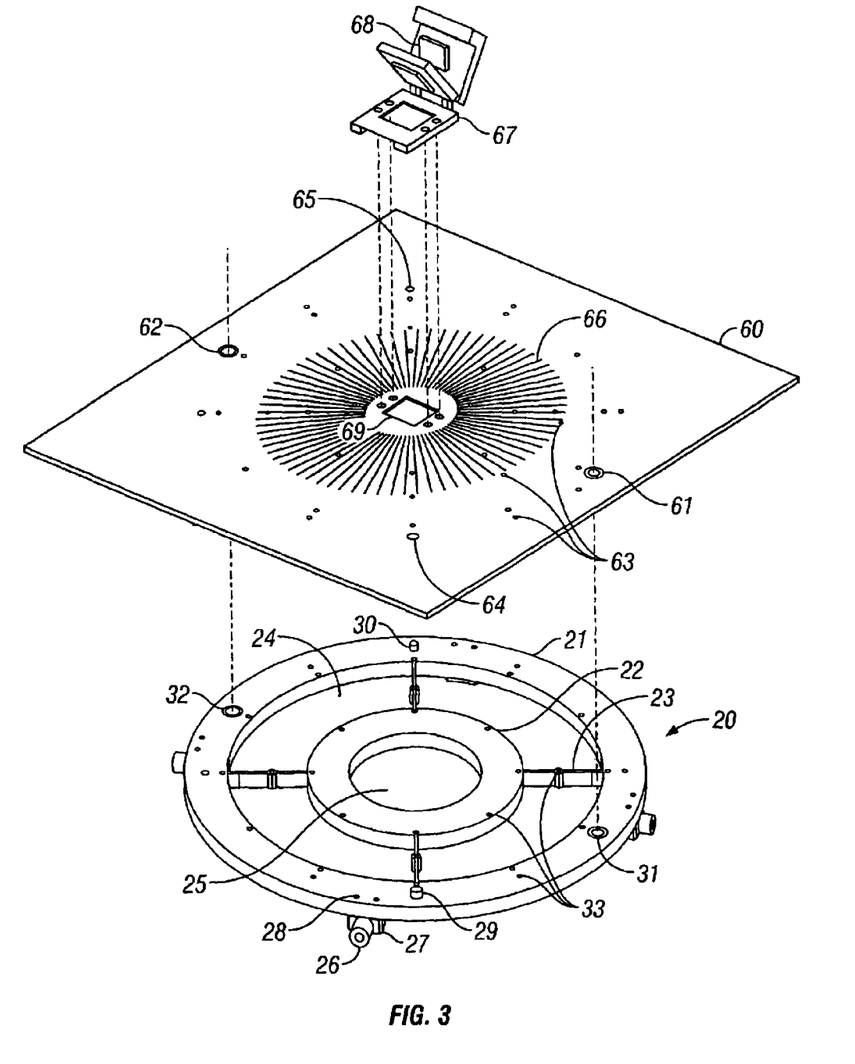
FIG. 3 is an exploded perspective view illustrating a loadboard assembly of the present invention with a socket and integrated circuit for testing.

FIG. 3 illustrates a loadboard assembly of the present invention. The loadboard assembly comprises a printed circuit board 60 secured to an interface board 20. A socket 67 is mounted to the printed circuit board 60 as shown by the four dashed lines. The socket 67 has a clam-shell shape in which an integrated circuit 68 is inserted for testing. Once the clam-shell of the socket 67 is closed, an electrical connection is established between the integrated circuit 68 and connection lines 66 of the printed circuit board 60. As will be discussed further with respect to FIG. 6, testing of the integrated circuit 68 is achieved by establishing contact between the connection lines 66 of the printed circuit board 60 and the contact pins 54 of the testing system.

The interface board 20 of the loadboard assembly is a metallic plate of aluminum alloy designed to provide stiffness to the printed board 60. It has two concentric annular members 21 and 22. The members 21 and 22 have different diameters such that the outer member 21 surrounds the inner member 22 with an annular-shaped space 24 between them. The interface board 20 further includes spacers 23 that span the annular-shaped space 24 to connect the outer member 21 and the inner member 22 at multiple points. The spacers divide the annular-shaped space 24 into a number of separate spaces. FIG. 3 illustrates four spacers 23 creating four separate spaces in the annual-shaped space 24, but any number of spacers can be used to connect the outer member 21 to the inner member 22. Contact pins 54 (which are not shown in FIG. 3) extend vertically through these spaces to establish electrical contact with connection lines 66 of the printed circuit board 60. An aperture 25 for contact pins may also be formed in the inner member 22. This is useful if the testing apparatus has a high pin count.

The outer member 21, the inner member 22 and the spacers 23 all have holes 33 which correspond to holes 63 on the printed circuit board. These holes are used to secure the interface board 20 to the back surface of the printed circuit board 60. The interface board 20 and the printed circuit board 60 can be secured or joined together by screws, studs or other similar connection means. Because the outer member 21, the inner member 22 and the spacers 23 are all used in securing the interface board 20 to the printed circuit board 60, the entire printed circuit board 60 is supported thereby providing enhanced stiffness to the printed circuit board 60. By having the interface board 20 secured to bottom surface of the printed circuit board 60, the entire top surface of the printed circuit board 60 is exposed. This allows for complete access to the printed circuit board 60 and removing any restrictions on its size.

To assist in properly securing the interface board 20 and the printed circuit board 60, the outer member 21 of the interface board 20 also includes two mechanical studs or pins 29 and 30 of different radii. Corresponding holes 64 and 65 in the printed circuit board 60 receive the two mechanical studs 29 and 30 when the interface board 20 and the printed circuit board 60 are secured together to form the loadboard assembly. Because the mechanical studs 29 and 30 have different radii, the interface board 20 and the printed circuit board 60 will only be joined if the studs 29 and 30 are correctly oriented to be received by their respective holes 64 and 65. Studs of the same radius may also provide orientation assistance by being asymmetrically placed on the outer member 21.

The outer member 21 of the interface board further includes two holes 31 and 32 with different diameters. Holes 31 and 32 have a common axis (as shown by the center lines in FIG. 3) and diameter with holes 61 and 62, respectively, on the printed circuit board 60. When the interface board 20 and the printed circuit board 60 are joined to form the loadboard assembly, each pair of holes 31/61 and 32/62 are in alignment. As will be discussed further with respect to FIGS. 5 and 6, each pair of holes is designed to receive a specific pin 50 and 51 located on the test head. This ensures that the loadboard assembly will only be received through the pins and onto the locking apparatus in the correct orientation. It should be noted that the pins 50 and 51 on the test head are a different size than the pins 29 and 30 used for aligning the interface board 20 and the printed circuit board 60.

The outer member 21 of the interface board 20 also includes four mounts 27 with interface board rollers 26. The mounts 27 are attached to the outer member 21 by screws 28 such that the interface board rollers 26 extend beyond the outer diameter of the outer member 21. As will be further explained with respect to FIGS. 6–8, the interface board rollers 26 are received in the cam slots of the locking apparatus and are cam followers as the cam member of the locking apparatus is moved. By following the cam member, the interface board rollers 26 move the interface board 20 (and the printed circuit board 60 if secured to the interface board 20) in a vertical direction relative to the test head. It should be noted that any number of mounts and rollers may be employed.

Although FIG. 3 illustrates the interface board 20 with two concentric annular members 21 and 22, any shape can be used for the two members. For example, the two members can be rectangular in shape. Moreover, materials other than aluminum alloy may be used for the interface board, such as steel or cast iron.

Figure 4:
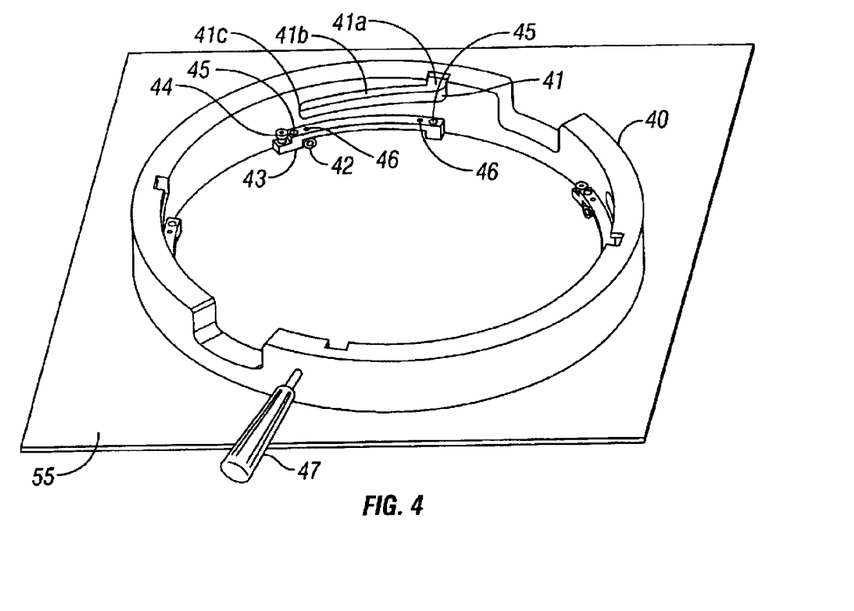
FIG. 4 is a perspective view of a cam member of the present invention.

FIG. 4 illustrates a cam member 40 of the locking apparatus of the present invention. The cam member 40 is an annular or ring-shaped structure made of aluminum alloy, steel, cast iron or any other similar material that rests on the top surface 55 of the test head (shown without any connections for contact pins). The inner peripheral surface of the cam member has four cam slots 41. Each cam slot 41 has an opening 41a. From the opening 41a, each cam slot 41 extends along the inner peripheral surface of the cam member 40 to form a groove 41b that terminates at a closed end 41c. Because the shape of cam member 40 is annular and because the opening 41a of cam slot 41 is above the end 41c of groove 41b, the profile of groove 41b is arcuate and slanted. As will be further explained with respect to FIGS. 6–8, each opening 41a of a cam slot 41 receives one of the interface board rollers 26 of the interface board 20. A rotation of the cam member 40 will guide the rollers 26 along the groove 41b such that the interface board 20 moves relative to the top surface of the test head in a vertical direction.

The cam member 40 is rotatable along the top surface 55 of the test head by four cam member rollers 42 resting on the top surface 55 of the test head. The cam member rollers 42 are secured to the inner peripheral surface of the cam member 40 and are guided by rails 43 during rotation. The rails 43 are secured separately from the cam member 40 to the top surface 55 of the test head by screws 45. Because the secured rails 43 abut the inner peripheral surface of the cam member 40, the rails also have an arcuate profile. As a result, when handle 47 is used to move the cam member 40, the cam member 40 is rotated in an arc-shaped movement between the two ends of the rails 43. At each end of the rails 43, there is a ball-point rivet 46 to act as detents to prevent inadvertent sliding of the roller 42 from the end position. Such rivets 46 may also be used in cam slots 41 to prevent the inadvertent sliding of the interface board rollers 26 in the slots. Rail rollers 44 secured to the rails 43 assist the cam member 40 to rotate smoothly.

Although the present invention has been described with four cam slots 41, four cam member rollers 42 and four rails 43, any number of slots, cam member rollers and rails may be utilized. It should also be noted that the cam member 40 may be moved by an automatic electric or pneumatic motor as opposed to manual movement through handle 47.

Figure 5:
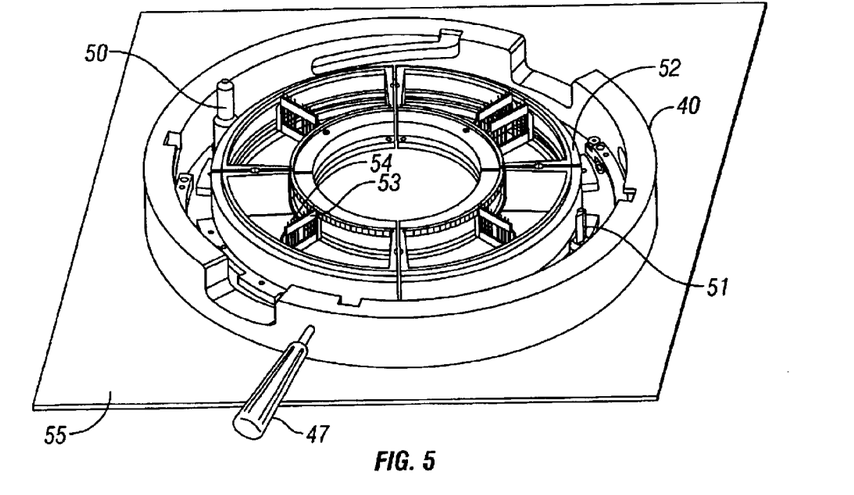
FIG. 5 is a perspective view of a locking apparatus of the present invention with an insert ring holding contact pins.

FIG. 5 illustrates the cam member 40 secured to the top surface 55 of the test head. Also secured to the top surface 55 of the test head are pins 50 and 51. Pins 50 and 51 are a mechanical stud and a radio pin, respectively, with different cross-sections. As discussed with respect to FIG. 3, the diameter of holes 31/61 is designed to only receive the radio pin 51. Similarly, the diameter of holes 32/62 is designed to only receive the mechanical stud 50. This ensures that the interface board 20 and the printed circuit board 60 are placed on the cam member 40 in the correct orientation.

FIG. 5 also illustrates an insert ring 52 inside the cam member 40 and secured to the top surface 55 of the test head. The insert ring 52 has four spacers with four apertures that correspond to the spacers 23 and apertures 24 of the interface board 20 illustrated in FIG. 3. Inserted within the spacers are a plurality of contact pin cards 53 with spring-loaded contact pins or pogo pins 54. FIG. 3 only shows five contact pins cards 53, but in use the spacers would be filled with pin cards 53. The contact pins 54 are directly connected to printed circuit boards that are in turn connected to a tester (not shown in FIG. 5). As will be discussed further with respect to FIG. 6, electrical contact is established between the tester and the integrated circuit when the loadboard 60 containing an integrated circuit 68 for testing is pressed onto the spring-loaded contact pins 54.

Figure 6:
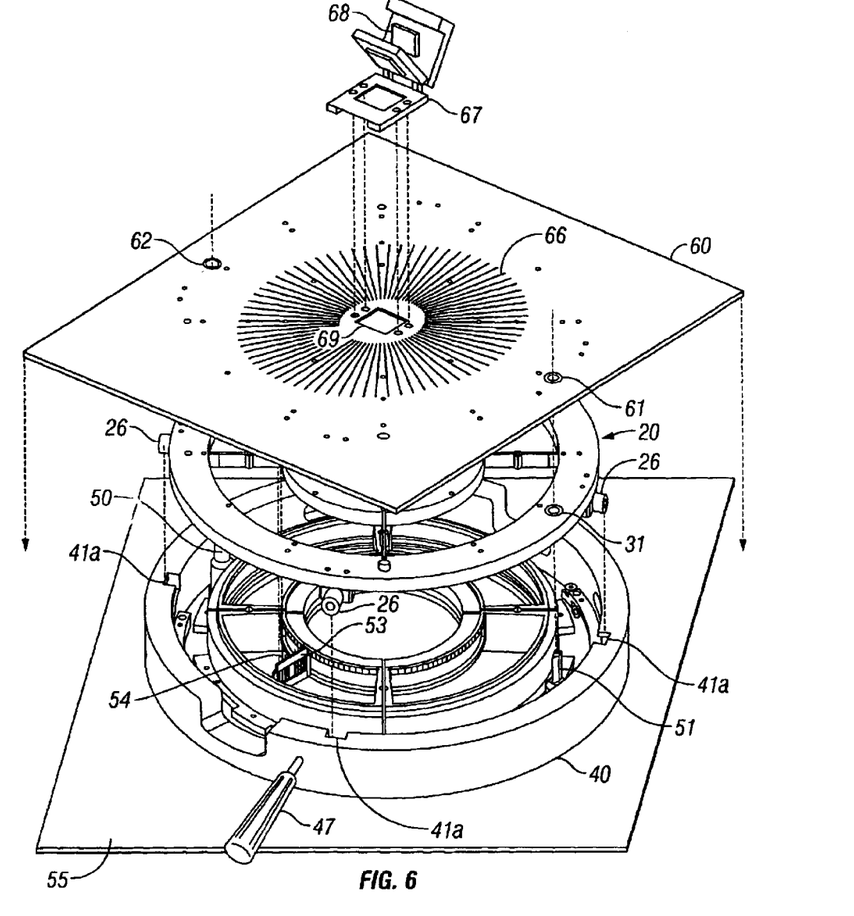
FIG. 6 is an exploded perspective view illustrating the placement of a loadboard assembly on a locking apparatus of the present invention.

FIG. 6 shows the assembly of the locking apparatus with the loadboard assembly containing an integrated circuit for testing. The loadboard assembly comprises the interface board 20 connected to the printed circuit board 60. As discussed above with respect to FIG. 3, a socket 67 is mounted onto the printed circuit board 60. Within the socket 67, there is inserted an integrated circuit 68 for testing. An electrical connection is established between the integrated circuit 68 and the spring-loaded contact pins 54 by the pressing the connection lines 66 of the printed circuit board 60 against the spring-loaded contact pins 54. This is achieved by connecting the loadboard assembly to the cam member 40 of the locking apparatus.

Correct orientation of the loadboard assembly is ensured through the use of holes 31/61 and 32 (not shown)/62 and mechanical stud 50 and radio pin 51. When the interface board 20 is connected to the printed circuit board 60, holes 31/62 and 32/62 are in alignment. Each pair of holes has a diameter designed to only receive a pin of given cross-section. If the loadboard assembly is not orientated such that holes 31/61 receive the radio pin 51 and holes 32/62 receive the mechanical stud 50, the interface board 20 of the assembly will not be inserted into the cam member 40.

If the orientation of the loadboard assembly is correct, the interface board rollers 26 of the interface board 20 are received in the openings 41a of the cam slots 41 as shown by the dashed lines in FIG. 6. The interface board 20 through its rollers 26 supports the printed circuit board 60 with the socket 67 and the integrated circuit 68 on the cam member 40. Additional support is provided by the mounts 27 of the interface board rollers 26 which can rest on top of the rails 43. The interface board 20 supports the printed circuit board 60 in a manner that allows the spring loaded contact pins 54 to extend through the annular-shaped space 24 of the interface board 20 and come into contact with the connection lines 66 of the printed circuit board 60 when the printed circuit board 60 is lowered. Although FIG. 6 illustrates more than one spring loaded contact pin 54 contacting a given connection line 66, each contact pin 54 contacts a separate connection line in use.

As FIG. 6 illustrates, the loadboard assembly and locking apparatus are configured to allow unlimited access to the printed circuit board 60. All of the elements for testing (except the socket 67 and the integrated circuit 68) are located below the printed circuit board 60. This arrangement also does not place any limitations on the size of the printed circuit board 60.

Figure 7A:
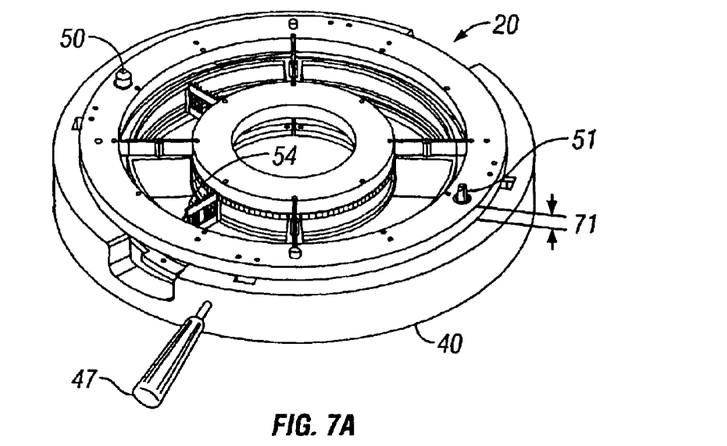
FIGS. 7A–7C are perspective views of a locking apparatus with an interface board of the present invention in various positions.
Figure 7B:
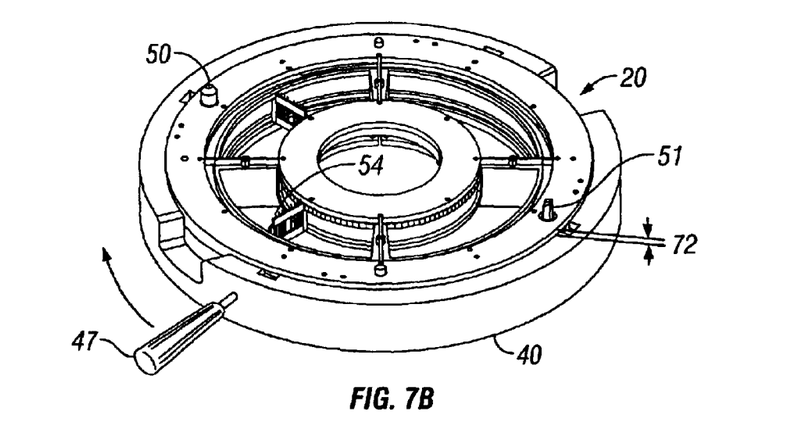
Figure 7C:
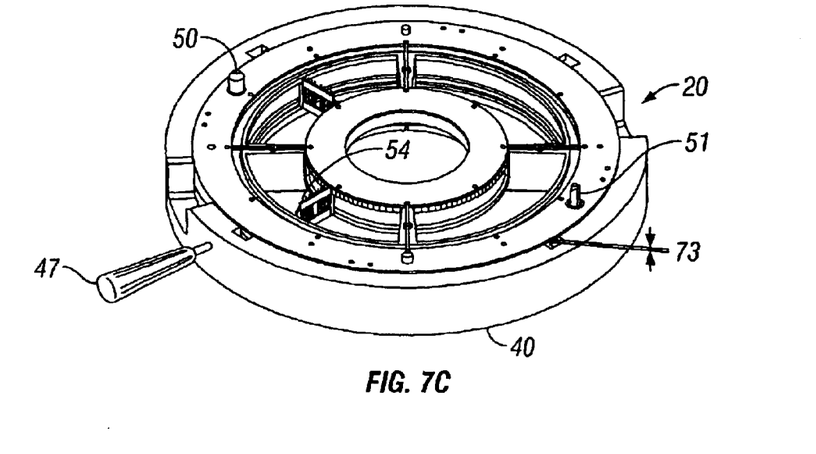
Figure 8A:
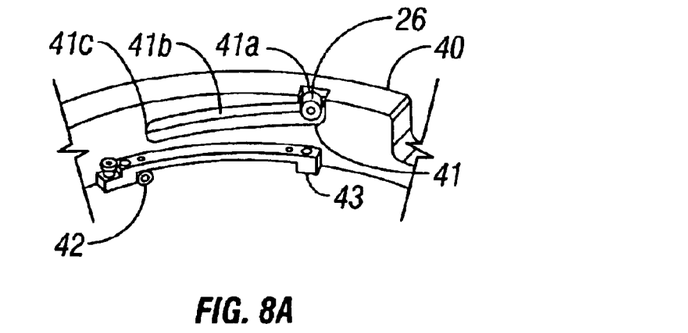
FIGS. 8A–8C are enlarged perspective views illustrating a section of a locking apparatus of the present invention in various positions.
Figure 8B:
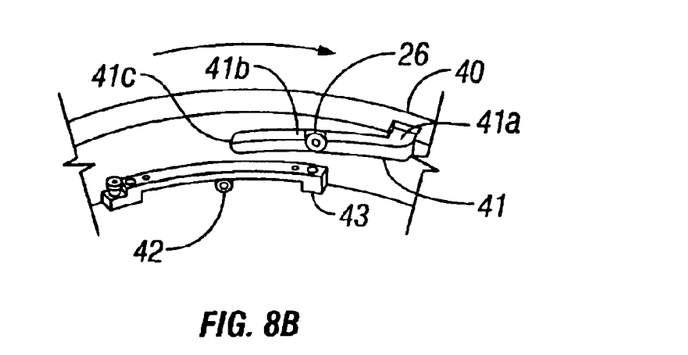
Figure 8C:
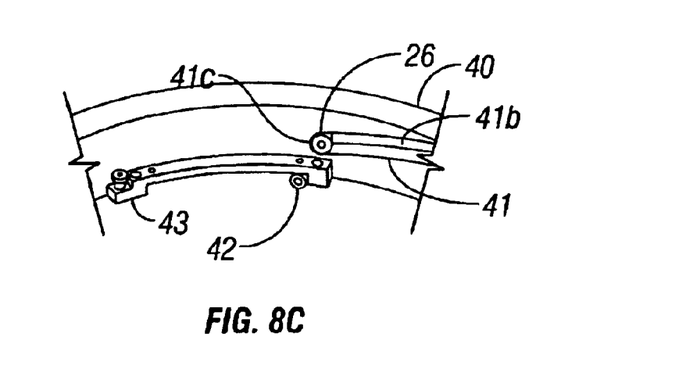

FIGS. 7 and 8 illustrate the locking apparatus and the loadboard assembly in three positions. The three positions correspond to the unlocked position, rotation position and the locked position. It should be noted that although the top surface of the interface board 20 is secured to the printed circuit board 60 for testing, FIGS. 7A–7C are shown without the printed circuit board 60 to illustrate the movement of the interface board 20. It should also be noted that FIGS. 8A–8C are partial interior views of the locking apparatus showing only a portion of cam member 40 with one cam slot 41 and showing only one rail 43. The movements shown in this partial interior view also occur in the other three cam slots 41 and rails 43 of the present invention.

FIGS. 7A and 8A illustrate the locking apparatus and the loadboard assembly in the unlocked position. The interface board 20 has been correctly oriented such that pins 50 and 51 are received through their respective holes of the interface board 20. The interface board 20 is thus shown as resting on the cam member 40 such that the top surface of the interface board 20 is at a distance 71 above the top surface of the cam member 40. As illustrated in FIG. 8A, the interface board roller 26 (shown without the mount 27 and the interface board 20) is received within the opening 41a of the cam slot 41. The cam member roller 42 is at an end of the rail 43 corresponding to the unlocked position.

FIGS. 7B and 8B illustrate the locking apparatus and the loadboard assembly during the rotation of the cam member 40. As the handle 47 of cam member 40 is pushed in the clockwise direction, cam member roller 42 moves from the end of rail 43. The movement of the cam member roller 42 is guided by the arcuate-shaped rail 43 such that the cam member roller 42 rotates the cam member 40 in an arc-shaped motion. As the cam member 40 rotates, the interface board 20 is kept from rotating by pins 50 and 51 which forces the interface board roller 26 to follow the cam slot 41 along the groove 41b of the cam slot 41. The profile of groove 41b is slanted at an angle given that the opening 41a is above the end 41c. As the interface board roller 26 follows the groove 41b, the interface board 20 is gradually lowered in the vertical direction. This is further illustrated in FIG. 7B. The distance 72 from the top surface of the interface board 20 to the top surface of cam member 40 during rotation is less than the distance 71 in the locked position as shown in FIG. 7A. In this manner, the printed circuit board 60 connected to the interface board 20 can be gradually lowered relative to the test head toward the contact pins 54.

FIGS. 7C and 8C illustrate the locking apparatus and the loadboard assembly in the locked position. The cam member roller 42 rotates the cam member 40 in a short arc-shaped motion until the roller 42 reaches the end of rail 43. The interface board roller 26 similarly follows the groove 41b until it reaches the end 41c. At this position, the interface board 20 is locked within the cam slots 41 of the cam member 40. Moreover, the interface board 20 has been further lowered such that the distance 73 from the top surface of the interface board 20 to the top surface of the cam member 40 in the locked position is less than the distance 72 during the rotation as shown in FIG. 7B. In this position, the connection lines 66 of the printed circuit board 60 are pressed into contact with the spring-load contact pins 54. The locked interface board 20 provides uniform pressure between the printed circuit board 60 and the contact pins 54 for proper testing.

After testing is completed, the printed circuit board 60 and the interface board 20 may be gradually raised by moving the handle 47 in a counterclockwise direction. The cam member rollers 42 move from the locked end of rails 43 to the unlocked end. As they do, the cam member 40 rotates forcing interface board rollers 26 to follow the grooves 41b toward the openings 41a. The slanted profile of grooves 41b gradually raises the interface board 20 and the printed circuit board 60 in a vertical direction relative to the test head and away from the contact pins 54. When the interface board rollers 26 reach the openings 41a of the cam slot 41, the interface board 20 and the printed circuit board 60 can be removed from the locking apparatus.

It should be noted that the profile of the cam slot 41 can be varied to obtain different ranges and/or directions of motion for the interface board 20.

Although the present invention has been described with a annular-shaped cam member 40 and an annular-shaped interface board 20, other arrangements may be utilized. One such arrangement is a rectangular-shaped cam member and interface board. The following discussion of the rectangular-shaped cam member and interface board will focus on certain structural differences between these members and their corresponding members in an annular arrangement. The discussion will not address alignment pins, the connection between the printed circuit board and the interface board and other similar matters that can be used in any arrangement.

In the rectangular arrangement, the interface board comprises two concentric squares or rectangles connected at multiple points through spacers in the same manner as shown in FIG. 3 with respect to interface board 20. Four mounts are attached on the outer rectangle of the interface board (although any number of mounts can be used). Two mounts are secured to one side of the outer rectangle while the other two mounts are secured on an opposite side of the outer rectangle. On each mount, a roller is attached. As with the interface board rollers 26 illustrated in FIG. 3, these rollers are to be received in the cam slots of the rectangular-shaped cam member.

The rectangular-shaped cam member or lock-arm is shaped like the interface board. It is slightly larger than the interface board such that the interface board can be received within it. The rectangular-shaped cam member has two cam slots on each side to receive the interface board rollers. Each cam slot has an opening and extends downwardly along the inner peripheral surface of the rectangular-shaped cam member to form a groove that terminates at a closed end. Because the shape of cam member is rectangular and because the opening of cam slot is above the end of the groove, the profile of the groove is linear and slanted. It should be noted that other profiles of the groove may be utilized.

The rectangular-shaped cam member also has cam member rollers attached to its sides that reside on the top surface of the test head. The rollers are guided by linear rails or lock-guides. Once a handle or other movement means is used to move the cam member, the cam member rollers guided by the rails move the cam member in a linear direction. The rollers of the interface board follow the linear and slanted profile of the grooves to gradually lower the interface board and the printed circuit board toward the contact pins to establish electrical contact for testing.

Although the present invention has been described with respect to testing integrated circuits in packaged form, the concept of the present invention is equally applicable to testing integrated circuits in wafer form. The concept of the present invention is also applicable to testing semiconductor devices other than integrated circuits.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A system for testing a semiconductor device by establishing electrical contact between said device and a plurality of pins on a test head, said system comprising:

a circuit board for mounting said device thereon;

a mounting plate connected to said circuit board, said mounting plate comprising an outer member having a plurality of cam followers, an inner member and a plurality of radial members, the outer member surrounding the inner member, said radial members extending inwardly from said outer member to retain the inner member in a centered position relative to said outer member wherein the outer member, the inner member and the radial members define a plurality of apertures, said plurality of pins extending through the plurality of apertures;

a cam member adapted to be secured to said test head, said cam member having a plurality of inclined cam slots, each cam slot having a top opening opposite the test head to receive a cam follower of said mounting plate and extending downward from the top opening toward the test head along an inner peripheral surface and terminating at a lower closed end, said cam member further having a plurality of rollers for movably supporting said cam member on the test head; and a plurality of rails adapted to be mounted on the test head and engaged with the rollers, each rail adapted to secure and guide a roller, wherein movement of said cam member in a horizontal plane relative to the test head engages the cam followers of the mounting plate to follow the cam slots such that said mounting plate and said circuit board move in a vertical direction relative to said test head such that said pins extending through said plurality of apertures contact said circuit board to establish said electrical contact.

2. The system according to claim 1 wherein said cam member is annular, each cam slot and rail has an arcuate profile and said movement is rotational movement.

3. The system according to claim 1 wherein said annular cam member is rectangular, each cam slot and rail has a linear profile and said movement is linear movement.

4. The system according to claim 1 wherein each rail has a detent at each end, said detent adapted to secure the movement of the roller of the cam member at each end.

5. The system according to claim 1 further comprising means for aligning said mounting plate and said circuit board relative to the test head.

6. The system according to claim 5 wherein said aligning means comprises a first pin mounted on the test head, said pin extending through a first pin aperture in said mounting plate and said circuit board.

7. The system according to claim 6 wherein said aligning means comprises a second pin mounted on the test head, said second pin extending through a second pin aperture in said mounting plate and said circuit board.

8. The system according to claim 7 wherein said first and second pins have different cross-sections.

9. The system according to claim 8 wherein said first and second pin apertures have different diameters.

10. The system according to claim 1 wherein each cam follower comprises a roller and a mount, the mount connected to said mounting plate.

11. The system according to claim 10 wherein the mount is positioned on a top surface of one of said plurality of rails.

12. The system according to claim 1 further comprising an electrical motor for moving said cam member.

13. The system according to claim 1 further comprising a pneumatic motor for moving said cam member.

* * * * *